United States Patent
Tsukihara et al.

(10) Patent No.: US 7,154,673 B2
(45) Date of Patent: Dec. 26, 2006

(54) LIGHT IRRADIATOR

(75) Inventors: Koichi Tsukihara, Kanagawa (JP); Koichi Tatsuki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/533,946

(22) PCT Filed: Oct. 24, 2003

(86) PCT No.: PCT/JP03/13648

§ 371 (c)(1),
(2), (4) Date: May 4, 2005

(87) PCT Pub. No.: WO2004/042807

PCT Pub. Date: May 21, 2004

(65) Prior Publication Data

US 2005/0270650 A1    Dec. 8, 2005

(30) Foreign Application Priority Data

Nov. 5, 2002    (JP) ............................ 2002-321704

(51) Int. Cl.
    G02B 27/10    (2006.01)
(52) U.S. Cl. ................ 359/618; 359/629; 359/633
(58) Field of Classification Search ................ 359/618, 359/627, 629, 630, 633
    See application file for complete search history.

(56) References Cited

U.S. PATENT DOCUMENTS

| | | | |
|---|---|---|---|
| 5,003,543 A | 3/1991 | Morsell et al. | |
| 5,071,225 A | 12/1991 | Inoue | |
| 6,310,726 B1 * | 10/2001 | Iizuka | ......................... 359/618 |
| 2003/0133197 A1 * | 7/2003 | Chang et al. | ............... 359/634 |
| 2004/0120050 A1 | 6/2004 | Tsukihara et al. | |

FOREIGN PATENT DOCUMENTS

| | | |
|---|---|---|
| JP | 01-148485 | 6/1989 |
| JP | 03-203715 | 9/1991 |
| JP | 05-341232 | 12/1993 |
| JP | 2001-185504 | 7/2001 |
| JP | 2001-374922 | 6/2004 |
| WO | WO91/11043 | 7/1991 |

* cited by examiner

Primary Examiner—Huy Mai
(74) Attorney, Agent, or Firm—Rader Fishman & Grauer PLLC; Ronald P. Kananen

(57) ABSTRACT

A light illuminating apparatus used for a laser annealing apparatus includes a first light splitting unit (16) and a second light splitting unit (20) for splitting a sole laser beam into n laser beams, and a synthesis unit (21) for synthesizing an m'th laser beam, radiated from the first light splitting unit (16), and an m'th laser beam radiated from the second light splitting unit (20), to each other, where m is an integer not less than 1 and not larger than n. The first light splitting unit (16) and the second light splitting unit (20) are formed by the same optical components and are arrayed inverted with respect to each other.

7 Claims, 9 Drawing Sheets

LIGHT IRRADIATOR

TECHNICAL FIELD

This invention relates to a light illuminating apparatus that may be applied with advantage to a laser annealing apparatus used, for example, for manufacture of a polysilicon thin film transistor.

The present application claims priority of Japanese Patent Application No. 2002-321704, filed in Japan on Nov. 5, 2002, the entirety of which is incorporated by reference herein.

BACKGROUND ART

Recently, a polysilicon film of high carrier mobility has come to be used as a channel layer of a thin film transistor used, for example, for a liquid crystal display. The polysilicon film, used as the channel layer of the thin film transistor, is routinely manufactured by heat-treating amorphous polysilicon on a glass substrate by illuminating laser light thereon. The method for heat-treating an object by illuminating laser light thereon is termed laser annealing and an apparatus for carrying out the laser annealing is termed a laser annealing apparatus.

In producing a polysilicon film, laser annealing needs to be carried out with a laser beam having uniform energy strength along the beam diameter, in order to prevent thin film transistor characteristics from becoming worsened.

However, with the collimated laser beam, formed, for example, by a collimator, the energy strength distribution within the beam diameter is of a Gaussian distribution.

That is, a usual collimated laser beam has a high strength in the center of the beam diameter, while having a low strength in a rim part of the laser beam. Thus, with the laser annealing device, it is necessary to form a laser light beam with a uniform strength distribution from the center up to the rim of the spot from the laser light beam having the Gaussian strength distribution within the beam diameter and to carry out heat treatment using the so formed laser light beam. The routine practice with the laser annealing device, the laser light radiated from a laser oscillator is collimated, for example, by a collimator, a plural number of laser beams are then formed by a light splitting means, such as a fly-eye lens, and the so formed laser beams are again combined together to provide for uniform strength distribution of the laser light illuminating area on a substrate.

Among known laser oscillators, there is a solid laser formed of a transparent material, such as crystal or glass, excluding a semiconductor, as a matrix material. The solid laser excites a solid laser material, composed of a matrix material and rare earth ions or transition metal ions doped therein, with light, to radiate a laser light beam.

With the solid laser, the radiated laser light is stable and has a long useful life. Hence, with use of the solid laser as a laser light source for the laser annealing device, it may be contemplated that the problem of instabilities, otherwise produced with the use of the excimer laser used as a customary light source for the laser annealing device, may be overcome.

The laser light radiated from the solid laser has high interfering properties as compared to the laser light radiated from the excimer laser. Thus, if the solid laser is used as the laser light source, and the laser light beams, split by the fly eye lens, are synthesized, the light beams interfere with one another. In the laser light, which has undergone the interference, interference fringes are produced in an illuminated light spot, such that it is not possible to provide for uniform strength distribution in the beam diameter.

For overcoming this drawback, the present Assignee has proposed, in the specification and drawings of Japanese Patent Application 2001-374922, a laser annealing device employing a light splitting optical means which may be used in place of the fly eye lens for splitting a sole laser light beam into plural laser light beams not interfering with one another.

The laser annealing apparatus, proposed in the aforementioned patent application is briefly explained. FIG. 1 schematically shows the annealing apparatus proposed in the aforementioned patent application.

In the laser annealing apparatus 100, shown in FIG. 1, a laser light beam L120 is radiated from a laser light source 101. The laser light beam L120, radiated from the laser light source 101, is collimated by a collimator 102 to fall on a light splitting unit 103.

The light splitting unit 103 includes first and second beam splitters 104, 105, and a reflecting mirror 106. The light splitting surface of the first beam splitter (BS) 104, the light splitting surface of the second beam splitter (BS) 105, and the light reflecting surface of a reflecting mirror 106 are all arranged parallel to one another.

The laser light beam L120, collimated by the collimator 102, is incident on the first BS 104. The first BS 104 separates the laser light beam L120 into a transmitted light beam (termed a laser light beam L121) and a reflected light beam (termed a laser light beam L122). The first BS 104 splits the light into the transmitted light beam and the reflected light beam at an intensity ratio of 1:1.

The laser light beam L121 falls on the second BS 105, which second BS 105 further splits the incident light L121 into a transmitted light beam (termed a laser light beam L123) and a reflected light beam (termed a laser light beam L124). The second BS 105 splits the light into the transmitted light beam and the reflected light beam at an intensity ratio of 1:1.

The laser light beam 123 falls on a first convex lens 107. The laser light beam L 124 is reflected by a reflective mirror 106 to fall on a second convex lens 108.

On the other hand, the laser light beam L122 is reflected by a reflecting mirror 106 to fall on the second BS 105. The second BS 105 further splits the incident laser light beam L122 into a transmitted light beam (termed a laser light beam L125) and a reflected light beam (termed a laser light beam L126). The second BS 105 splits the light into the transmitted light beam and the reflected light beam at an intensity ratio of 1:1.

The laser light beam 125 falls on a third convex lens 109. The laser light beam L126 is reflected by the reflective mirror 106 to fall on a fourth convex lens 110.

The four laser light beams L123, L124, L125 and L126, thus generated, are parallel to one another and are each of an intensity one-fourth that of the pre-splitting laser light beam L120.

The laser light beams L123 to L126 are once condensed by the first to fourth convex lenses 107 to 110, respectively, so as to be then incident on a condenser lens 111, which condenser lens 111 then illuminates the laser light beams L123 to L126 in a preset range on a substrate 112.

With the above-described laser annealing apparatus 100, the spacing t between the light splitting surface of the first BS 104 and that of the second BS 105 and a spacing t between the light splitting surface of the first BS 104 and the reflecting surface of the reflecting mirror 106 are set so as to satisfy the following equation 1:

$$t > L/(2n\cos\theta) \quad (1)$$

where L is the coherence length of the laser light beam radiated from the laser light source 101, n is the refractive index of a medium between the light separating surfaces and a medium between the light separating surfaces and the reflecting mirror, and θ is the angle of incidence of the incident light beam on the light splitting surfaces.

Thus, even though the laser light beams L123 to L126 are radiated from the same laser light source 101, the totality of the light paths are longer than the coherence length, such that none of these light beams interfere with one another. Hence, with the laser annealing apparatus 100, the preset range of the substrate 112 can be illuminated with the uniform intensity, without forming interference fringes, and hence the object to be illuminated may be illuminated uniformly in its entirety.

Meanwhile, with the above-described laser annealing device 100, the ratio of the volume of light transmission and that of light reflection by the BS 104 and the BS 105 is ideally 1:1. However, due to manufacturing tolerances, the ratio of the volume of light transmission and light reflection actually is not 1:1. On the other hand, it is desirable that the reflectance of the reflective mirror 106 is ideally 100%. However, due to manufacturing tolerances, the reflectance actually is lower than 100%. Consequently, the laser light beams L123 to L126, radiated from the light splitting unit 103, are actually not uniform in intensity, even though it is ideally desirable for these light beams to be uniform in intensity.

FIG. 2 depicts a graph showing the values of light intensity of the laser light beams L123 to L126 in case the ratio of the reflectance and transmittivity of the BS 104 and the BS 105 suffers an error of 2% and the reflectance of the reflective mirror 106 is 99%. FIG. 2 shows the proportions of the intensity of the respective laser light beams L124 to L126, with the intensity of the laser light beam L123 as a reference.

It may be seen from FIG. 2 that, in case the four laser light beams L124 to L126 are generated under the above conditions, there results the difference in the light intensity of the order of 17%. The reason that this large difference in light intensity is produced despite the small values of the errors of the BS 104, BS 105 and the reflective mirror 106 is that the components of manufacturing tolerances are accumulated as a result of multiple reflection.

DISCLOSURE OF THE INVENTION

It is an object of the present invention to provide a novel light illuminating apparatus whereby the problem inherent in the above-described conventional technique may be obviated.

It is another object of the present invention to provide a novel light illuminating apparatus whereby, in splitting a sole laser beam into plural laser light beams, the intensity of the respective split laser light beams may be equalized.

The present invention provides a light illuminating apparatus including first radiating means of an optical structure having one or more light separating surface for transmitting and reflecting a laser beam for splitting the laser beam into a transmitted laser beam and a reflected laser beam The first radiating means routes a sole laser beam incident thereon through the one or more light separating surface to generate n laser beams, where n is a natural number not less than two. The light illuminating apparatus also includes second radiating means of the same optical structure as the first radiating means. The second radiating means routes a sole laser beam incident thereon through the one or more light separating surface to generate n laser beams. The light illuminating apparatus also includes light synthesizing means for synthesizing one laser beam each of the n laser beams radiated by the first radiating means so as to be incident on the light synthesizing means, and one laser beam each of the n laser beams radiated by the second radiating means so as to be incident on the light synthesizing means, to generate n laser beams.

The light synthesizing means synthesizes an m'th laser beam, generated by the first radiating means, and an (n−m+1)st laser beam, generated by the second radiating means, on one and the same axis, provided that the n laser beams generated by the first radiating means and the n laser beams generated by the second radiating means are ranked from a rank 1 to a rank n in the increasing order of optical path lengths of the n laser beams resulting from transmission and reflection along passageways of generation of the laser beams, m being an optional number from 1 to n.

Other objects and advantages of the present invention will become more apparent from the following description of the embodiments thereof especially when read in conjunction with the accompanying drawings.

BEST MODE FOR CARRYING OUT THE INVENTION

Figure 1:
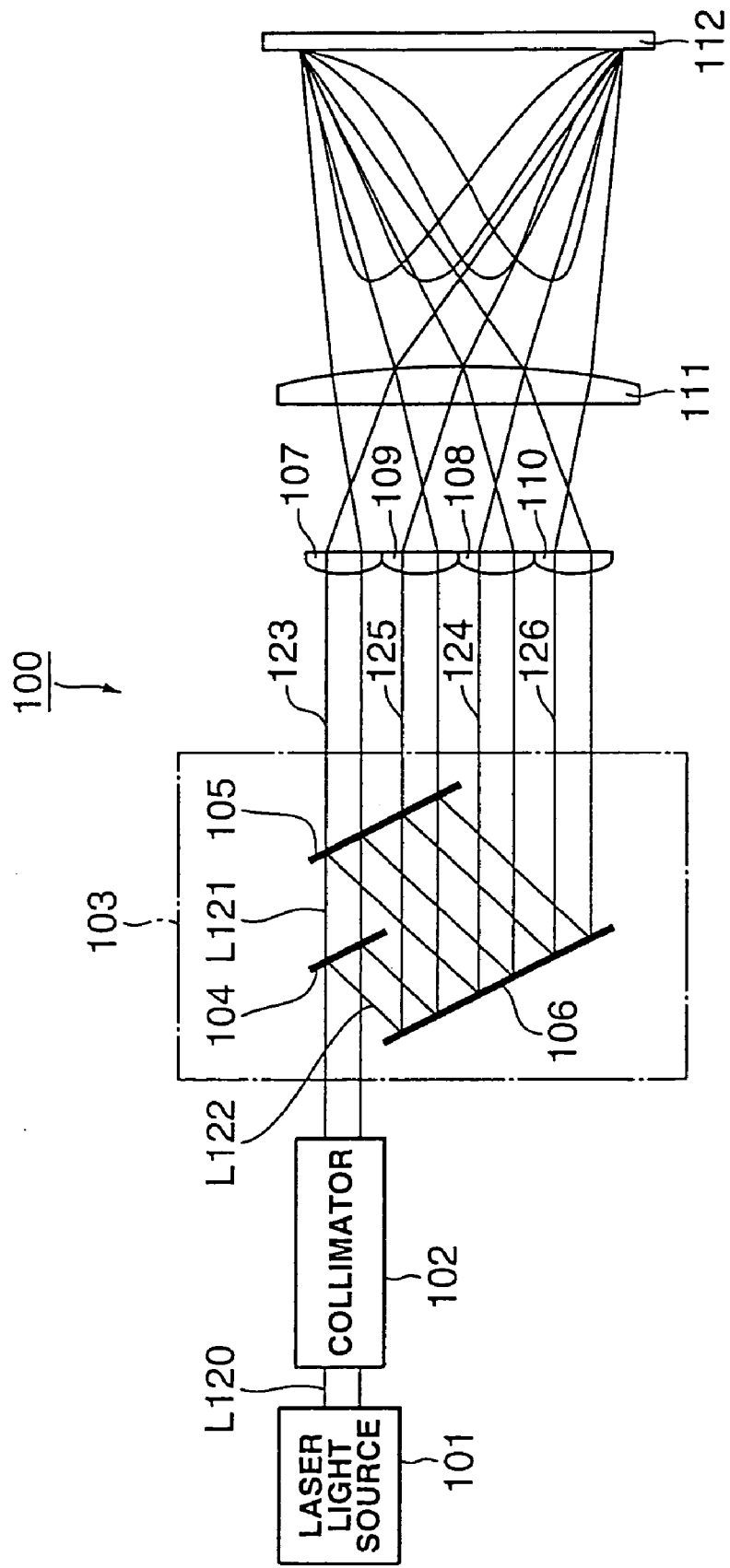
FIG. 1 is a schematic view showing the structure of a conventional laser annealing device.
Figure 2:
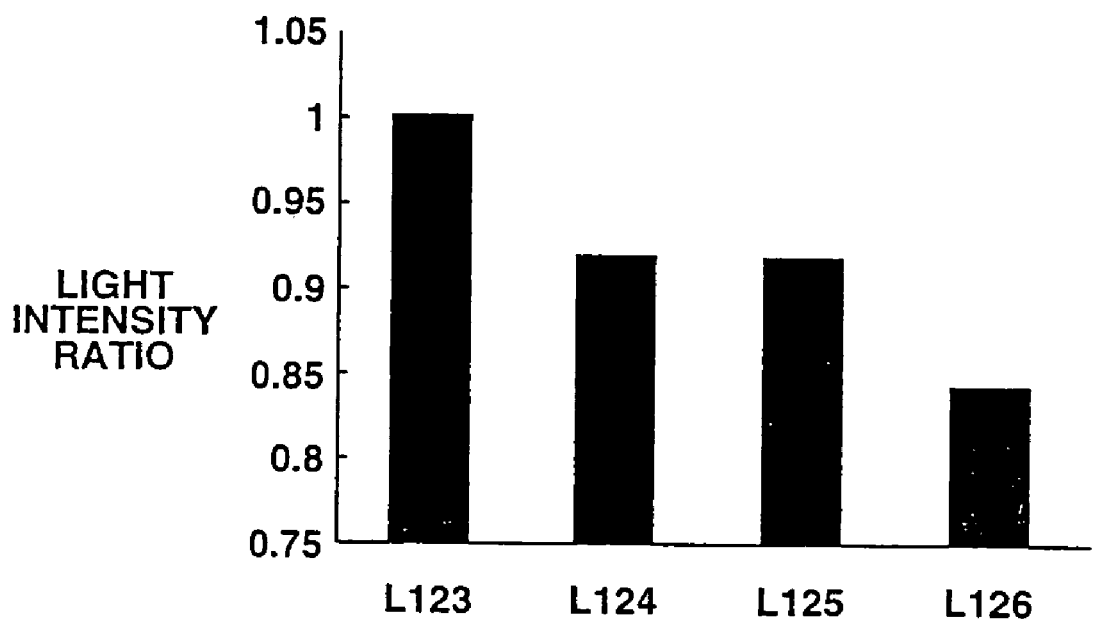
FIG. 2 is a graph showing the distribution of light intensities of the four laser light beams as split by the laser annealing device shown in FIG. 1.

Referring to the drawings, a laser annealing device, embodying the present invention is explained in detail. The laser annealing device according to the present invention, now explained, is a device for heat-treating the substrate by illuminating the laser light on a substrate as a flat-plate-shaped subject of annealing. For example, the laser annealing device according to the present invention is used for forming a channel layer of a thin film transistor used as a switching device for a liquid crystal display device or an organic EL display device. More specifically, the laser annealing device is used for heat-treating an amorphous silicon film, formed on a glass substrate, to form a polysilicon film thereon.

First Embodiment

Figure 3:
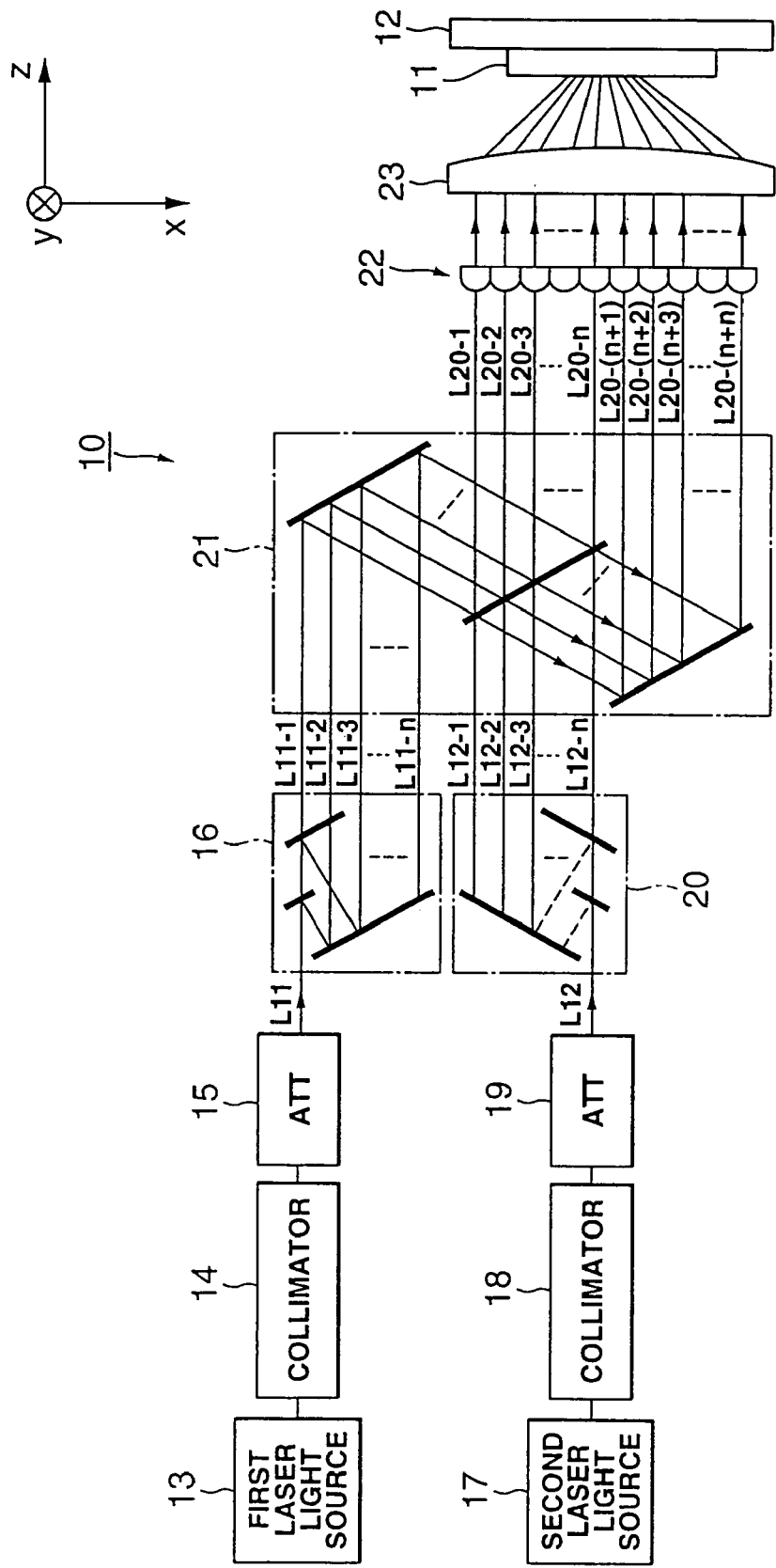
FIG. 3 is a schematic view showing the structure of a laser annealing device according to a first embodiment of the present invention.

A first embodiment of the present invention is now explained. Referring to FIG. 3, a laser annealing device 10 of the present embodiment includes a stage 12, on which to set a substrate 11, a first laser light source 13 for radiating laser light, a first collimator 14 provided on an optical path of the laser light radiated from the first laser light source 13, a first attenuator 15 provided on the same optical path, and a first light splitting unit 16 for splitting the laser light, radiated from the first attenuator 15, into n laser light beams. The laser annealing device 10 also includes a second laser light source 17 for radiating the laser light, a second collimator 18, arranged on the optical path of laser light, radiated from the second laser light source 17, a second attenuator 19, arranged on the same optical path, and a second light splitting unit 20 for splitting the laser light, radiated from the second attenuator 19, into n laser light beams. The number n above of the laser light beam is a natural number.

The laser annealing device 10 according to the present invention also includes a light synthesis unit 21 for mixing n laser beams radiated from the first light splitting unit 16 and n laser beams radiated from the second light splitting unit 20, to radiate (2×n) laser light beams, a lens array 22 formed by (2×n) convex lenses and on which the (2×n) laser light beams, radiated from the light synthesis unit 21, are incident, and a condenser lens 23 for routing the (2×n) laser light beams, radiated from the lens array 22, to a preset area on the substrate 11.

The stage 12 includes a flat planar surface on which to set the flat-plate-shaped substrate 11. The stage 12 is moved in the directions indicated by arrows X and Y in FIG. 3, that is, in a direction parallel to the major surface thereof, as it holds the substrate 11 set thereon. With the laser annealing device 10, the relative position between the substrate 11 and a spot of the laser light illuminated thereon can be shifted by causing movement of the stage 12. In short, an annealing point on the substrate 11 may be controlled by causing movement of the stage 12. The stage 12 may be moved under control by a controller, not shown.

The first laser light source 13 and the second laser light source 17 each output a sole laser light beam by pulsed oscillations. The laser annealing device 10 uses a solid laser as the first laser light source 13 and the second laser light source 17. The solid laser is such a device for exciting a solid laser material, composed of a transparent matrix material, such as crystals or glass, excluding semiconductors, doped with rare earth ions or ions of transition metals, with light, to radiate a laser beam. As the solid laser, glass laser, composed of a glass matrix material, and doped with $Nd^{3+}$, ruby laser composed of ruby and doped with $Cr^{3+}$, or YAG laser composed of yttrium aluminum garnet (YAG) doped with $Nd^{3+}$, may be used. These lasers may be changed in wavelength, using a non-linear optical crystal, if so desired. A semiconductor laser may also be used in place of the solid laser.

Although the first laser light source 13 and the second laser light source 17 radiate the laser light beams of the same wavelength, these laser light sources are different laser oscillators. The laser light beams, radiated by these laser oscillators, do not interfere with each other, even if the beams are combined together.

The laser light, radiated by the first laser light source 13, is incident on the first collimator 14. The incident laser light is turned by the first collimator 14 into a parallel laser beam of a preset beam diameter. The laser light radiated from the first collimator 14 falls on the first attenuator 15. This first attenuator 15 adjusts the intensity of the incident laser light. The laser light radiated from the first attenuator 15 falls on the first light splitting unit 16.

The laser light, radiated by the second laser light source 17, is incident on the second collimator 18. The incident laser light is turned by the second collimator 18 into a parallel laser beam of a preset beam diameter. The laser light radiated from the second collimator 18 falls on the second attenuator 19. This second attenuator 19 adjusts the intensity of the incident laser light. The laser light radiated from the second attenuator 19 falls on the second light splitting unit 20.

In the following, the laser light incident from the first attenuator 15 on the first light splitting unit 16 is termed a laser light beam L11, whilst the laser light incident from the second attenuator 19 on the second light splitting unit 20 is termed a laser light beam L12. These laser light beams L11, L12 are adjusted by the collimators 14, 18 and by the attenuators 15, 19, respectively, so as to be equal in the intensity and in the beam diameter.

The first light splitting unit 16 splits the incident laser light beam L11 to radiate n parallel laser light beams, arrayed at an equal interval from one another. The optical paths of the n laser light beams, radiated from the first light splitting unit 16, are arrayed e.g. along the X-direction in FIG. 3. Moreover, the n laser light beams, radiated from the first light splitting unit 16, are laser light beam not interfering with one another. For example, in the first light splitting unit 16, the lengths of the optical paths, formed to split the laser light beam, differ from one radiated laser light beam to another. In short, the optical paths from the incident port to the exit port of the laser light L11 differs from one radiated laser light beam to another. Moreover, the lengths of the optical paths are caused to differ a distance not less than the coherence length as prescribed by the first laser light source 13. Consequently, the laser light beam radiated are in the state of not interfering with one another.

The n laser light beams, radiated from the first light splitting unit 16, are numbered in accordance with the arraying order for explanation. The n laser light beams, radiated from the first light splitting unit 16, are arrayed along the x-direction, and are numbered for incrementing one by one sequentially from one side of the x-direction. Specifically, the first laser light from one side of the x-direction is labeled L11-1, the second laser light beam is labeled L11-2, the third laser light beam is labeled L11-3 and so on, and finally the number n (n'th) laser light beam is labeled L11-*n*.

The second light splitting unit 20 splits the incident laser light beam L12 to radiate n laser light beams arrayed in parallel at an equal interval from one another. The optical paths of the n laser light beams, radiated from the second light splitting unit 20, are formed e.g. on an X-Z plane in FIG. 3, and are arrayed along the x-direction. It is noted that the n laser light beams, radiated from the second light splitting unit 20, are laser light beams not interfering with one another. With the second light splitting unit 20, for example, the lengths of the optical paths, provided for splitting the laser beam, differ from one laser light beam radiated to another. Specifically, the length of the optical path from the light incident port to the light exiting port for the laser light beam L12 differ from one laser light beam to another. Additionally, the optical paths are caused to differ from one another by a distance not less than the coherence length as prescribed by the second light splitting unit 17. Consequently, the outgoing laser light beams are in a state of not interfering with one another.

The n laser light beams, radiated from the second light splitting unit 20, are numbered in accordance with the arraying order for explanation. The n laser light beams, radiated from the second light splitting unit 20, for example, are arrayed along the direction of an arrow X, and are numbered for incrementing one by one sequentially from one side of the X-direction. Meanwhile, the direction of incrementing the numbers is the same as that for the first light splitting unit 16. Specifically, the first laser light from one side of the x-direction is labeled L112-1, the second laser light beam is labeled L12-2, the third laser light beam is labeled L12-3 and so on, and finally the number n (n'th) laser light beam is labeled L12-$n$.

It is noted that the first light splitting unit 16 and the second light splitting unit 20 use the same optical components, with the manner of arraying these optical components in the light splitting units also being the same.

However, the first light splitting unit 16 and the second light splitting unit 20 are oriented in a position inverted by 180° about an axis parallel to the direction of the optical axis of the outgoing laser light beam. That is, the first light splitting unit 16 and the second light splitting unit 20 are oriented in a position inverted by 180° about the Z-axis in FIG. 3 as center.

Consequently, the laser light beams, radiated from the first light splitting unit 16 and the second light splitting unit 20, are related to each other as follows: That is, the optical path within the first light splitting unit 16, formed for generating the first laser light beam L11-1 of the first light splitting unit 16, is the same as that within the second light splitting unit 20, formed for generating the nth laser light beam L12-$n$ in the second light splitting unit 20. Moreover, the optical path within the first light splitting unit 16, formed for generating the second laser light beam L11-2 of the first light splitting unit 16, is the same as that within the second light splitting unit 20, formed for generating the (n−1)st laser light beam L12-(n−1) in the second light splitting unit 20. Additionally, the optical path within the first light splitting unit 16, formed for generating the third laser light beam L11-3 of the first light splitting unit 16, is the same as that within the second light splitting unit 20, formed for generating the (n−2)nd laser light beam L12-(n−2) in the second light splitting unit 20.

In short, the optical path within the first light splitting unit 16 for generating the m'th laser light beam L11-$m$ of the first light splitting unit 16, is the same as the optical path within the second light splitting unit 20 for the (n−m+1)st laser light beam L2($n$−m+1) of the second light splitting unit 20. Consequently, the m'th laser light beam of the first light splitting unit 16 and the (n−m+1)st laser light beam of the second light splitting unit 20 are generated from the incident laser light by traversing the same optical components.

A more specified illustrative structure of the first light splitting unit 16 and the second light splitting unit 20 will be explained below in more detail.

The n laser light beams L11-1 to L11-$n$, radiated from the first light splitting unit 16, and the n laser light beams L12-1 to L12-$n$, radiated from the second light splitting unit 20, are incident on the light synthesis unit 21.

The light synthesis unit 21 synthesizes the n laser light beams L11-1 to L11-$n$, radiated from the first light splitting unit 16, and the n laser light beams L12-1 to L12-$n$, radiated from the second light splitting unit 20, to radiate (2×n) laser light beams, arrayed parallel to and at equal intervals from one another. The n laser light beams, radiated from the light synthesis unit 21, are arrayed e.g. along the direction X in FIG. 3. The (2×n) laser light beams are all equal in intensity.

The (2×n) output laser light beams, radiated from the light synthesis unit 21, are numbered in the arraying order. More specifically, the first laser light beam, output from the light synthesis unit 21, is labeled the laser light beam L20-1, the second laser light beam is labeled the laser light beam L20-2, the third laser light beam is labeled the laser light beam L20-3, the n'th laser light beam is labeled the laser light beam L20-$n$, the (n+1)st laser light beam is labeled the laser light beam L20-(n+1), and the (n+n)th laser light beam is labeled the L20($n$+n).

An illustrative structure of the light synthesis unit 21 is explained in detail hereinbelow.

The (2×n) output laser light beams (L20-1 to L20-(n+n)), output from the light synthesis unit 21, are incident on the lens array 22.

This lens array 22 is made up by (2×n) convex lenses, arranged in a single straight line at equal intervals from one another, along the arraying direction of the (2×n) output laser light beams, radiated from the light synthesis unit 21 (e.g. in the direction of arrow X in FIG. 3). The arraying interval of the convex lenses is the same as the interval of the output laser light beams, radiated from the light synthesis unit 21, such that the respective convex lenses are provided on the optical axes of the respective output laser light beams. The output laser light beams, radiated from the lens array 22, are condensed and are subsequently incident on the condenser lens 23.

The condenser lens 23 synthesizes the (2×n) output laser light beams, condensed by the lens array 22, onto a preset area for illumination on the substrate 11, and illuminates the so synthesized light on the substrate 11.

With the above-described laser annealing device 10, the substrate 11 is set on the stage 12, and subsequently the laser annealing process is started. When the laser annealing process in the laser annealing device 10 commences, pulsed laser light is radiated from the first laser light source 13 and the second laser light source 17.

The laser light, radiated from the first laser light source 13, is transmitted through the first collimator 14, first attenuator 15 and the first light splitting unit 16 and thereby turned into n parallel laser beams of the same intensity not interfering with one another. The laser light, radiated from the second laser light source 17, is transmitted through the second collimator 18, second attenuator 19 and the second light splitting unit 20 and thereby turned into n parallel laser beams of the same intensity not interfering with one another.

The n laser light beams, radiated from each of the first light splitting unit 16 and the second light splitting unit 20, are combined together by the light synthesis unit 21 to generate (2×n) output laser light beams. The (2×n) output laser light beams are synthesized together by the lens array 22 and the collimator 23 so as to be illuminated on a preset area on the substrate 11.

With the laser annealing device 10, the stage 12 is translated for causing movement of the flat-plate-shaped substrate 11 in a direction parallel to the major surface thereof (in a direction of X-Y in FIG. 3), in order to illuminate the laser light on the entire area of the substrate 11 to carry out the annealing.

The structures of the first light splitting unit 16, second light splitting unit 20 and the light synthesis unit 21 are explained in further detail. In the following explanation, the structures of the first light splitting unit 16, second light splitting unit 20 and the light synthesis unit 21 is explained for a case where the number of the laser light beams, radiated from each of the first light splitting unit 16 and the second light splitting unit 20, is four, that is, for a case where n=4.

Figure 4:
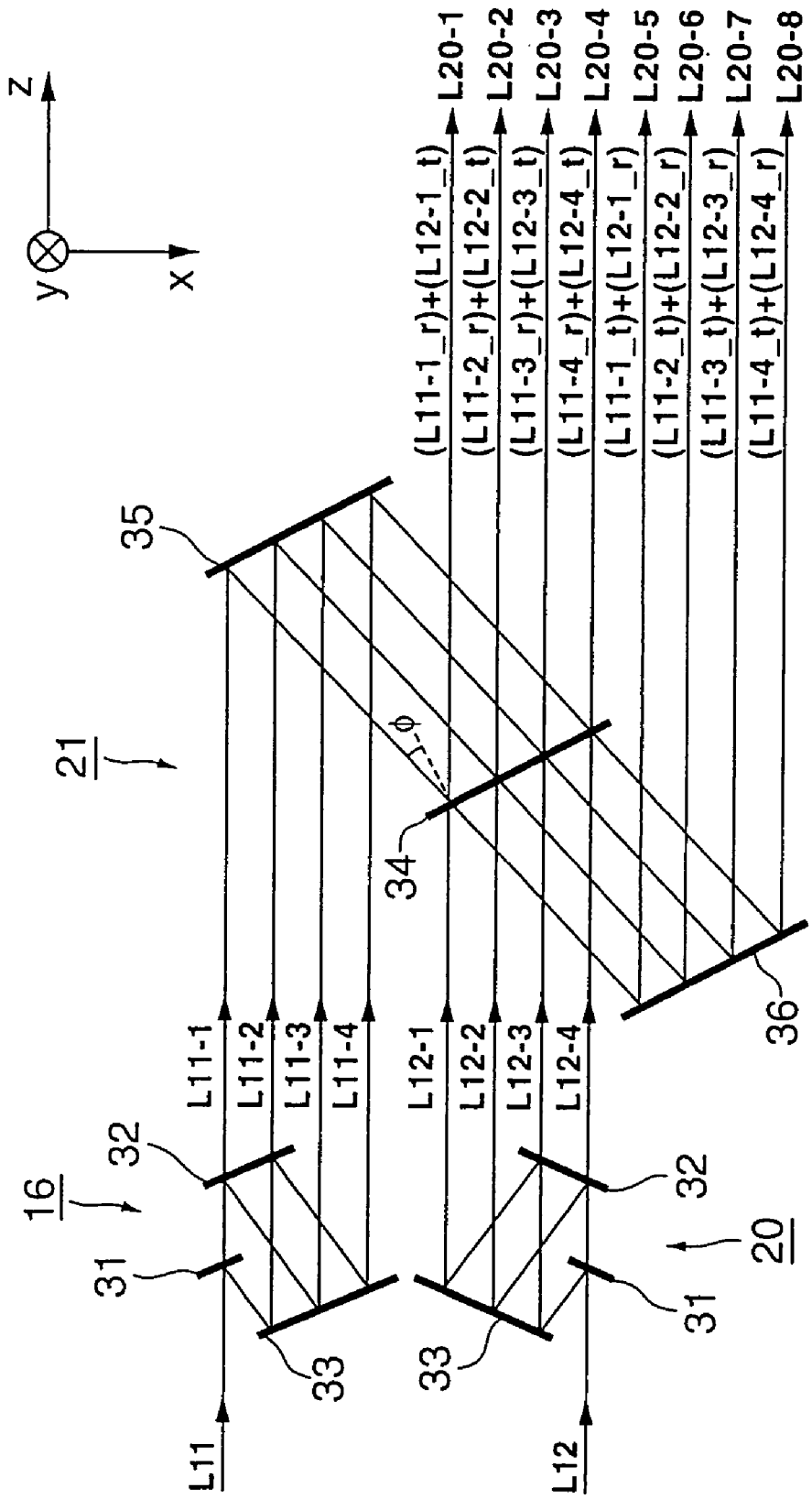
FIG. 4 is a schematic view showing the structure of a splitting optical system and a synthesizing optical system of the laser annealing device shown in FIG. 3.
Figure 5:
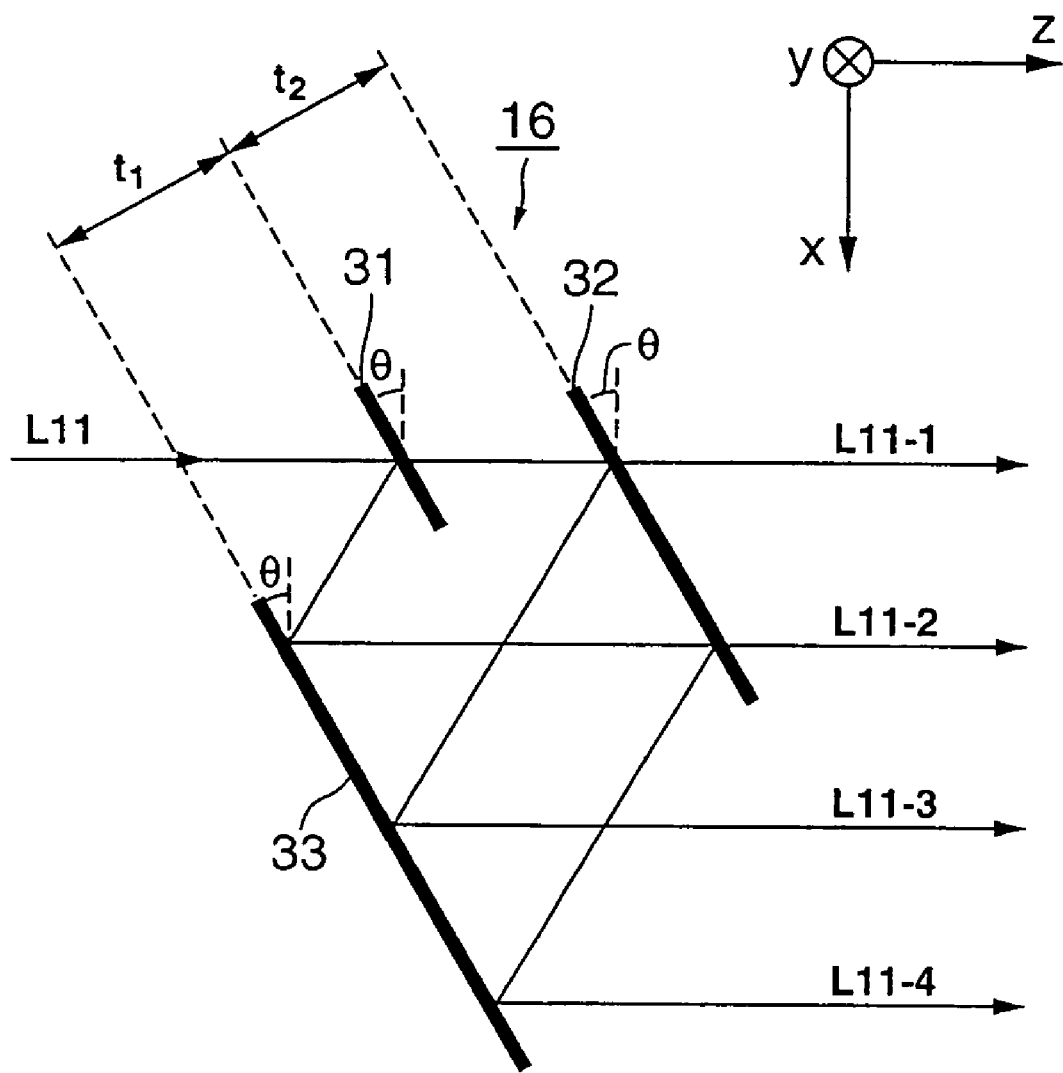
FIG. 5 is a schematic view showing an example of the splitting optical system.

FIG. 4 shows the structure of the first light splitting unit 16, second light splitting unit 20 and the light synthesis unit 21 in case n=4. FIG. 5 shows the structure of the first light splitting unit 16 for the case where n=4. The direction of incidence of the laser light beams L11, L12 on the first light splitting unit 16 and the second light splitting unit 20 is the Z-direction, which is a direction perpendicular to the major surface of the stage 12. It is noted that the four laser beams, radiated from the first light splitting unit 16 and the second light splitting unit 20, are in parallel array in a preset orientation. The arraying direction of the laser light beams is termed the X-direction. Meanwhile, the X-direction and the Z-direction are perpendicular to each other.

Referring to FIGS. 4 and 5, the first light splitting unit 16 includes a first beam splitter (BS) 31 and a second beam splitter (BS) 32. The first BS 31 and the second BS 32 are arrayed so that planar light separating surfaces thereof are arrayed along the Z-direction, and are each a device that transmits and reflects the laser light beam incident on the light separating surface thereof to separate the laser light into two laser light beams. The ratio of separation by transmission and reflection is designed to be 1:1.

The first light splitting unit 16 includes a mirror 33 having a light reflecting surface parallel to the light separating surfaces of the first BS 31 and the second BS 32. The mirror is arrayed in a side-by-side relation with respect to the first BS 31 and the second BS 32 along the Z-direction. The mirror 33 is a device for reflecting the laser light incident on its planar light reflecting surface. The mirror 33 is arranged closer than the first BS 31 to the incident side of the laser light L11.

The light separating surfaces of the first BS 31 and the second BS 32 and the light reflecting surface of the mirror 33 are arranged perpendicular to the plane defined by the X-Z axes at a preset angle $\theta$ (0°<$\theta$<90°) with respect to the incident direction of the incident laser light beam L11, that is, to the X-direction. In short, the laser light L11 is incident at an incident angle $\theta$ to the light separating surfaces of the first BS 31 and the second BS 32.

The first BS 31 is arranged on the optical axis of the first laser light beam L11-1. The second BS 32 is similarly arranged on the optical axis of the first laser light beam L11-1. The first BS 31 is of a size and an array such that only the laser light beam L11 is incident thereon while the other laser beams are not incident thereon. The second BS 32 is of a size and an array such that the light transmitted through the first BS 31 and the light reflected by the mirror 33 and then reflected by the BS 31 are incident thereon while the other laser beams are not incident thereon. The mirror 33 is of a size and an array such that the light beam reflected by the first BS 31 and two laser beam reflected by the second BS 32 are incident thereon while the mirror does not obstruct the passage of the laser light beam L11-1.

The first BS 31 and the mirror 33 are separated from each other by a distance $t_1$ which is set to $L/2\cos\theta$ or larger, where L is the coherence length as set by the first laser light source 13. The first BS 31 and the second BS 32 are also separated from each other by a distance $t_2$ which is set to $L/2\cos\theta$ or larger where L is the coherence length as set by the first laser light source 13.

The first light splitting unit 16, constructed as described above, is able to radiate four laser light beams, arrayed as parallel beams along the X-direction and which do not interfere with one another.

Specifically, the first laser light beam L11-1 is generated on the path of light transmitted through the first BS1 and the second BS2. The second laser light beam L11-2 is generated on the path of light reflected by the first BS1 and on the path of light transmitted through the second BS2. The third laser light beam L11-3 is generated on the path of light transmitted through the first BS1 and on the light path reflected by the second BS2. The fourth laser light beam L11-4 is generated on the path of light reflected by the first BS1 and the second BS2.

The four laser light beams, radiated from the first light splitting unit 16, are generated on traversing the optical paths not less than the coherence length, so that, when the beams are combined together, no interference is produced.

In short, when the length of the optical path of the first laser light beam L11-1 is compared to that of the second laser light beam L11-2, the distance $t_1$ between the first BS 31 and the mirror 33 is not less than $L/2\cos\theta$, where L is the coherence length, so that the length of the optical path of the second laser light beam L11-2 is longer by not less than the coherence length. When the length of the optical path of the second laser light beam L11-2 is compared to that of the third laser light beam L11-3, the distance $t_2$ between the first BS 31 and the second BS 32 is not less than $L/2\cos\theta$, where L is the coherence length, so that the length of the optical path of the third laser light beam L11-3 is longer by not less than the coherence length. When the length of the optical path of the third laser light beam L11-3 is compared to that of the fourth laser light beam L11-4, the distance $t_1$ between the first BS 31 and the mirror 33 is not less than $L/2\cos\theta$, where L is the coherence length, so that the length of the optical path of the fourth laser light beam L11-4 is longer by not less than the coherence length.

The second light splitting unit 20, employing the same optical components as those of the first light splitting unit 16, described above, is of the same structure as the first light splitting unit 16.

However, the second light splitting unit 20 is rotated through 180° about the direction of radiation of the output laser light (Z-axis direction) as axis, as shown in FIG. 4.

Consequently, the first laser light beam L12-1 is generated on a path of light reflected by the first BS 31 and by the second BS 32. The second laser light beam L11-2 is generated on a path of light transmitted through the first BS 31 and reflected by the second BS 32. The third laser light beam L11-3 is generated on a path of light reflected by the first BS 31 and transmitted through the second BS 32. The fourth laser light beam L11-4 is generated on a path of light transmitted through the first BS 31 and the second BS 32.

The light synthesis unit 21 includes a beam splitter 34 reflecting and transmitting the incident laser light for separating the incident laser light into two laser light beams, as shown in FIG. 4. The light separating surface of the beam splitter 34 is perpendicular to the X-Z plane. The ratio of separation by transmission and reflection is set to 1:1.

The four laser light beams L-11-1 to L-11-4, radiated from the first light splitting unit 16, are reflected by the mirror 35 and subsequently incident on the beam splitter 34 via its one surface, referred to below as a front surface. The four laser beams L12-1 to L12-4, radiated from the second light splitting unit 20, are incident on the beam splitter 34 via its surface opposite to the surface on which the laser light from the first light splitting unit 16 was incident. This opposite surface is referred to below as a back surface.

The sum total of eight laser light beams, radiated from the first light splitting unit 16 and the second light splitting unit 20, is incident on the beam splitter 34 along a surface perpendicular to the light splitting surface of the beam splitter 34, that is, along the X-Z plane. The respective laser light beams are incident on the light separating surface of the beam splitter 34 at a preset angle $\phi$ ($0°<\phi<90°$). It is noted that the laser light beams L11-1 to L11-4, radiated from the first light splitting unit 16, and the laser light beams L12-1 to L12-4, radiated from the second light splitting unit 20, are incident on the beam splitter so that the optical axes of the two laser beams are not confounded with each other.

Moreover, the first laser light beam L11-1, radiated from the first light splitting unit 16, and the first laser light beam L12-1, radiated from the second light splitting unit 20, are incident on the same position on the light separating surface of the beam splitter 34, even granting that the point where the first laser light beam is incident on the separating surface is on the front surface of the light separating surface and the point where the second laser light beam is incident on the separating surface is on the back surface thereof. The second laser light beam L11-2, radiated from the first light splitting unit 16, and the second laser light beam L12-2, radiated from the second light splitting unit 20, are incident on the same position on the light separating surface of the beam splitter 34. The third laser light beam L11-3, radiated from the first light splitting unit 16, and the third laser light beam L12-3, radiated from the second light splitting unit 20, are incident on the same position on the light separating surface of the beam splitter 34. The fourth laser light beam L11-4, radiated from the first light splitting unit 16, and the second laser light beam L12-4, radiated from the second light splitting unit 20, are incident on the same position on the light separating surface of the beam splitter 34.

Consequently, a reflected light beam L11-1_r of the first laser light beam L11-1, radiated from the first light splitting unit 16, and a transmitted laser beam L12-1_t of the first laser light beam L12-1, radiated from the second light splitting unit 20, are combined together on the same axis and radiated as an output laser beam L20-1. A reflected light beam L11-2_r of the second laser light beam L11-2, radiated from the first light splitting unit 16, and a transmitted laser beam L12-2_t of the second laser light beam L12-2, radiated from the second light splitting unit 20, are combined together on the same axis and radiated as an output laser beam L20-2. A reflected light beam L11-3_r of the third laser light beam L11-3, radiated from the first light splitting unit 16, and a transmitted laser beam L12-3_t of the third laser light beam L12-3, radiated from the second light splitting unit 20, are combined together on the same axis and radiated as an output laser beam L20-3. A reflected light beam L11-4_r of the fourth laser light beam L11-4, radiated from the first light splitting unit 16, and a transmitted laser beam L12-4_t of the fourth laser light beam L12-4, radiated from the second light splitting unit 20, are combined together on the same axis and radiated as an output laser beam L20-4.

A transmitted laser beam L11-1_t of the first laser light beam L11-1, radiated from the first light splitting unit 16, and a reflected laser beam L12-1_r of the first laser light beam L12-1, radiated from the second light splitting unit 20, are combined together on the same axis and radiated as an output laser beam L20-5. A transmitted laser beam L11-2_t of the second laser light beam L11-2, radiated from the first light splitting unit 16, and a reflected laser beam L12-2_r of the second laser light beam L12-2, radiated from the second light splitting unit 20, are combined together on the same axis and radiated as an output laser beam L20-6. A transmitted laser beam L11-3_t of the third laser light beam L11-3, radiated from the first light splitting unit 16, and a reflected laser beam L12-3_r of the third laser light beam L12-3, radiated from the second light splitting unit 20, are combined together on the same axis and radiated as an output laser beam L20-7. A transmitted laser beam L11-4_t of the fourth laser light beam L11-4, radiated from the first light splitting unit 16, and a reflected laser beam L12-4_r of the fourth laser light beam L12-4, radiated from the second light splitting unit 20, are combined together on the same axis and radiated as an output laser beam L20-8.

The output laser beams L20-5 to L20-8 are reflected by mirror 36 and radiated collimated with respect to the output laser beams L20-1 to L20-4.

Thus, with the laser annealing device 10 according to the present invention, described above, the first light splitting unit 16 and the second light splitting unit 20 use the same optical components, with the internal structures of the optical components being the same. The first light splitting unit 16 and the second light splitting unit 20 are inverted 180° relative to each other about the optical axis of the radiated laser light as center axis. Moreover, with the laser annealing device 10 of the present embodiment, the m'th laser light beam L11-$m$ of the first light splitting unit 16 and the m'th laser light beam L12-$m$ of the second light splitting unit 20 are combined together by the light synthesis unit 21, where m is such that $1 \leq m \leq n$.

In this manner, with the laser annealing device 10 according to the present invention, the laser light beams, separated on traversing two paths, where the pattern of reflection and transmission is symmetrical with respect to each other, are combined together. Thus, with the present first embodiment of the laser annealing device 10, even if difference is produced in the proportions of separation by transmission and reflection in the beam splitters of the separating optical system, it is possible to counterbalance the error by synthesizing the laser light beams.

Figure 6:
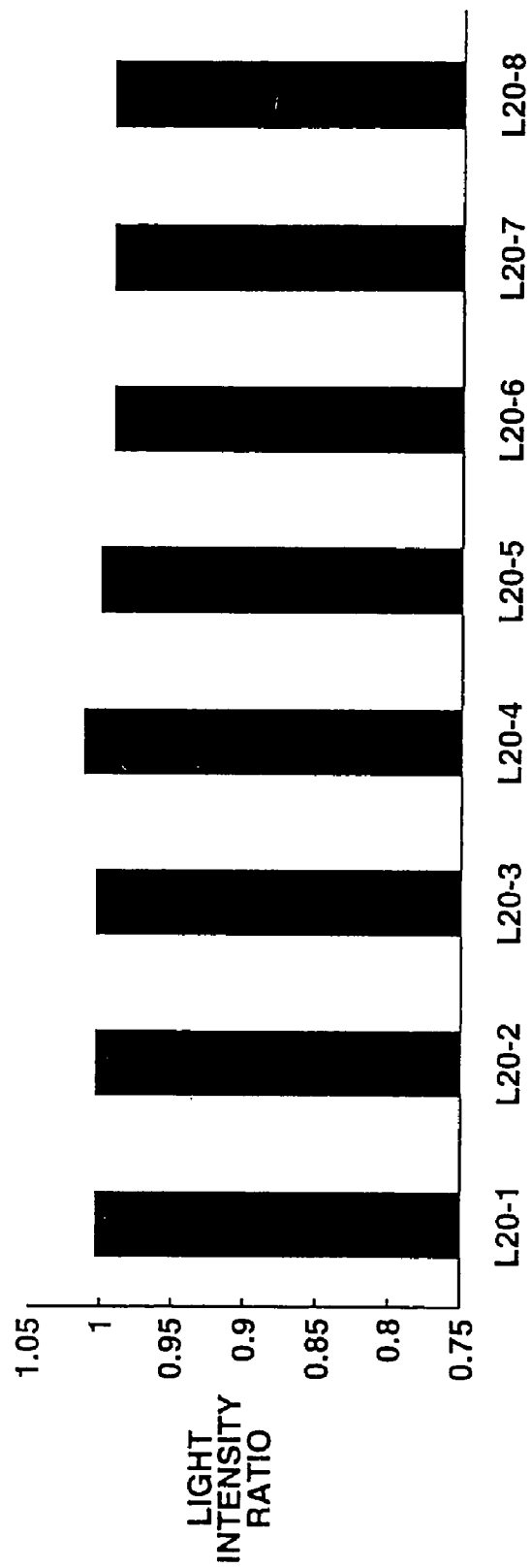
FIG. 6 is a graph showing the distribution of light intensities of eight laser light beams as split by the laser annealing device according to the present invention.

FIG. 6 depicts a graph showing the intensities of the laser light beams L20-1 to L20-8 for such a case where an error in the ratio of the reflected light volume and the transmitted light volume of the BS 31 of the first light splitting unit 16 and the second BS 32 of the second light splitting unit 20 shown in FIG. 4 is 2% and the reflectance of the mirror 33 is 99%. More specifically, FIG. 6 shows proportions of light intensities of the laser light beams L20-2 to L20-8, against the light intensity of the laser light beam L20-1 as a reference.

It is seen from FIG. 6 that, in case the eight laser light beams L20-1 to L20-8 are generated under the above-described conditions, there is a difference only of the order of 1.1% in the intensities of the laser light beams.

An illustrative structure in case n=4 has been shown as a specified example of the first light splitting unit 16 and the second light splitting unit 20, a similar configuration may be achieved for other than the case of n=4 by increasing the number of the beam splitters. That is, in case the number of beam splitters is j, j being a natural number, it is possible to radiate n=$2^j$ laser light beams.

With the number n of the laser beams, split by the first light splitting unit 16 and the second light splitting unit 20, with an i'th beam splitter BSi and with the maximum number of i, that is, with the number of the beam splitters provided in the beam splitting unit being k, n and k are related with each other by the following equation 2:

$$n=2^k \quad (2).$$

The number of times of transmission m and the number of times of reflection i of a laser beam in the i'th beam splitter BSi are correlated with each other as indicated by the following equation (3):

$$m=2^{(i-1)} \quad (3).$$

The transmissitivy T of the BSi is as indicated by the following equation (4):

$$T=0.5i \quad (4),$$

whilst the reflectance of the BSi is as indicated by the following equation (5):

$$R=0.5i \quad (5).$$

On the other hand, in order for the n output laser light beams to be incoherent laser beams, that is, laser beams not interfering with one another, the beam splitters and the reflective mirrors need to be arranged in the following manner.

Let the angle of incidence of the laser beams to the beam splitters be θ and also let the coherence length of the laser beams be L.

The distance t0 between the first BS and the reflective mirror is set as indicated by the following equation 6:

$$t0 \geq L/(2\cos\theta) \quad (6)$$

whilst the distance t(j−1) between the first beam splitter BS1 and the j'th beam splitter BSj is set as indicated by the following equation 7:

$$tj \geq ((2^{(j-1)}-1)L/(2\cos\theta) \quad (7)$$

where j is an integer from 2 to k.

Moreover, in case a medium with a refractive index n is provided between the beam splitters and between the beam splitter and the reflective mirror, and the n output laser light beams are to be incoherent laser beams, that is, laser beams not interfering with one another, the respective beam splitters and the reflective mirrors need to be arranged in the following manner.

The distance t0 between the first beam splitter and the reflective mirror is set as shown by the following equation (8):

$$t0 \geq L/(2n\cos\theta) \quad (8)$$

whilst the distance (j−1) between the first beam splitter BS1 and the j'th beam splitter BSj is set as indicated by the following equation (9):

$$tj \geq (2^{(j-1)}-1)L/(2n\cos\theta) \quad (9)$$

where j is an integer from 2 to k.

By arranging the beam splitters in this manner, a sole laser beam may be split into n parallel laser beams incoherent with respect to one another and which are of the same value of light intensity.

Second Embodiment

The laser annealing device of the second embodiment of the present invention is now explained. In the following explanation of the present second embodiment of the laser annealing device, parts or components used in common with the above-described first embodiment are depicted by the same reference numerals and detailed description therefor is omitted for simplicity.

Figure 7:
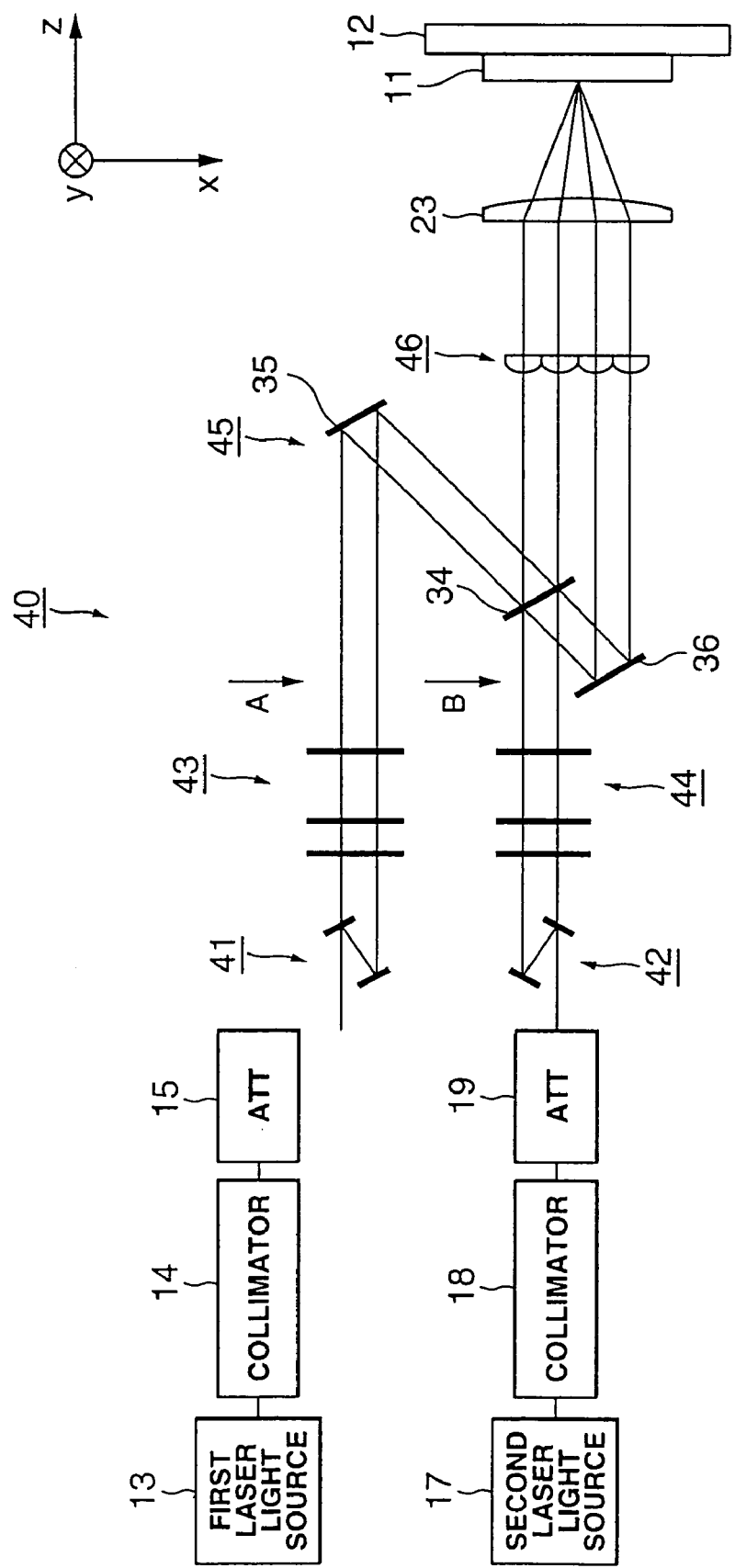
FIG. 7 is a schematic view showing the structure of a laser annealing device according to a second embodiment the present invention.

Referring to FIG. 7, a laser annealing device 40 of the second embodiment of the present invention includes a stage 12, on which to set a substrate 11, a first laser light source 13 for radiating the laser light, a first collimator 14 provided on an optical path of the laser light radiated from the first laser light source 13, and a first attenuator 15 provided on the same optical path. The laser annealing device 10 also includes a second laser light source 17 for radiating a laser light beam, a second collimator 18, arranged on the optical path of the laser light, radiated from the second laser light source 17, and a second attenuator 19, arranged on the same optical path.

The laser annealing device 40 of the present invention, shown in FIG. 7, includes a first horizontal laser beam splitting unit 41 for splitting the laser light beam, radiated from the first attenuator 15, into two laser light beams in the horizontal direction indicated by arrow X in FIG. 7, a second horizontal laser beam splitting unit 42 for splitting the laser light beam, radiated from the second attenuator 19, into two laser light beams in the horizontal direction, a first vertical laser beam splitting unit 43 for splitting each of the two laser light beams, split by the first horizontal laser beam splitting unit 41, into four beams in the vertical direction indicated by arrow Y in FIG. 7 to output a sum of eight laser light beams, and a second vertical laser beam splitting unit 44 for splitting each of the two laser light beams, split by the second horizontal laser beam splitting unit 42, into four beams in the vertical direction to output a sum of eight laser light beams. The laser annealing device also includes a laser beam synthesis unit 45 for mixing eight laser light beams radiated from the first vertical laser beam splitting unit 43 and eight laser light beams radiated from the second vertical laser beam splitting unit 44 to radiate sixteen laser light beams, a lens array 46 formed by sixteen convex lenses and on which are incident the sixteen laser light beams radiated from the laser beam synthesis unit 45, and a condenser lens 23 for conducting the sixteen laser light beams radiated from the lens array 46 to a preset area on the substrate 11.

The laser light beam, outgoing from the first attenuator 15, is incident on the first horizontal laser beam splitting unit 41, whilst the laser light beam, outgoing from the second attenuator 19, is incident on the second horizontal laser beam splitting unit 42.

The first horizontal laser beam splitting unit 41 splits the incident laser light beam along the X-direction to radiate two laser light beams arrayed parallel to and at an equal spacing from each other. The optical paths of the two laser light beams, radiated from the first horizontal laser beam splitting unit 41, are arrayed e.g. along the X-direction in FIG. 7. Moreover, the two laser light beams, radiated from the first horizontal laser beam splitting unit 41, are laser light beams not interfering with each other. For example, in the first horizontal laser beam splitting unit 41, the lengths of the optical paths, formed in order to split the laser light beam, differ from one radiated laser light beam to another. That is, the length of the optical path from a laser light incident port to a laser light exit port differs for the two laser light beams. In addition, the optical paths differ from each other by a length not less than the coherence length. The first horizontal laser beam splitting unit 41 may, for example, be implemented by the configuration of the light splitting unit 16 shown in FIG. 5, less the BS 32.

The second horizontal laser beam splitting unit 42 splits the incident laser light beam along the X-direction to radiate two laser light beams arrayed parallel to and at an equal spacing from each other. The optical paths of the two laser light beams, radiated from the second horizontal laser beam splitting unit 42, are arranged e.g. along the X-direction shown in FIG. 7. The two laser light beams, radiated from the second horizontal laser beam splitting unit 42, are laser light beams not interfering with each other. For example in the second horizontal laser beam splitting unit 42, the lengths of the optical paths, formed for splitting the laser light, differ for the outgoing laser light beams. In short, the length of the optical path from the laser light incident port to the laser light exit port for one of the two laser light beam differs from that for the other laser light beam. In addition, the optical paths differ from each other by a length not less than the coherence length prescribed for the second laser light source 17. The second horizontal laser beam splitting unit 42 may, for example, be implemented by the configuration of the light splitting unit 16 shown in FIG. 7, less the BS 32.

It should be noted that the first horizontal laser beam splitting unit 41 and the second horizontal laser beam splitting unit 42 use the same optical components, with the manner of arraying these optical components in the light splitting units also being the same. However, the first light splitting unit 41 and the second light splitting unit 42 are oriented with axial symmetry about an axis parallel to the direction of the optical axis of the radiated laser light beam as center. That is, the first light splitting unit 41 and the second light splitting unit 42 are oriented in a position inverted by 180° about the direction of radiation of the laser light beam, that is, about the Z-axis in FIG. 7, as center.

The two laser light beams, radiated from the first light splitting unit 41, are incident on the first vertical laser beam splitting unit 43, whilst the two laser light beams, radiated from the second light splitting unit 42, are incident on the second vertical laser beam splitting unit 44.

The first vertical laser beam splitting unit 43 splits the two laser light beams, arrayed parallel to each other along the X-direction in FIG. 7, into four laser beams, along the Y-direction in FIG. 7, independently of each other. Hence, the first vertical laser beam splitting unit 43 radiates a sum total of eight laser light beams. The eight laser light beams, radiated from the first vertical laser beam splitting unit 43, are in the form of a matrix of two columns arrayed in the X-direction in FIG. 7 and four columns arrayed in the Y-direction in FIG. 7. The eight laser light beams, radiated from the first vertical laser beam splitting unit 43, are laser light beams not interfering with each other. For example, the length of the optical path from a laser light incident port to a laser light exit port differs for each of the laser light beams. In addition, the optical paths differ from each other by a length not less than the coherence length as prescribed by the first laser light source 13. The first vertical laser beam splitting unit 43 may, for example, be implemented by the configuration of the first light splitting unit 16 rotated 90° about the Z-direction as center.

The second vertical laser beam splitting unit 44 splits the two laser light beams, arrayed parallel to each other along the X-direction in FIG. 7, into four laser beams, along the Y-direction in FIG. 7, independently of each other. Hence, the first vertical laser beam splitting unit 43 radiates a sum total of eight laser light beams. The eight laser light beams, radiated from the second vertical laser beam splitting unit 44, are in the form of a matrix of two columns arrayed in the X-direction in FIG. 7 and four columns arrayed in the Y-direction in FIG. 7. The eight laser light beams, radiated from the second vertical laser beam splitting unit 44, are laser light beams not interfering with each other. For example, the length of the optical path from a laser light incident port to a laser light exit port differs for the laser light beams along the vertical direction. In addition, the optical paths differ from each other by a length not less than the coherence length as prescribed by the second laser light source 17. The second vertical laser beam splitting unit 44 may, for example, be implemented by the configuration of the first light splitting unit 16 of FIG. 7, rotated −90° about the Z-direction as center.

Figure 8:
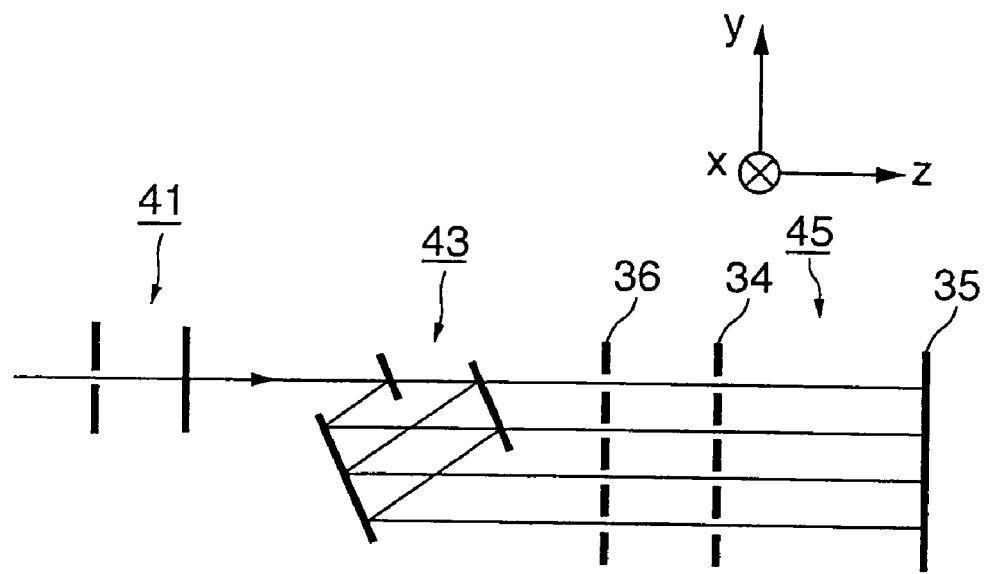
FIG. 8 is a schematic view showing a first splitting optical system of the laser annealing device shown in FIG. 7.
Figure 9:
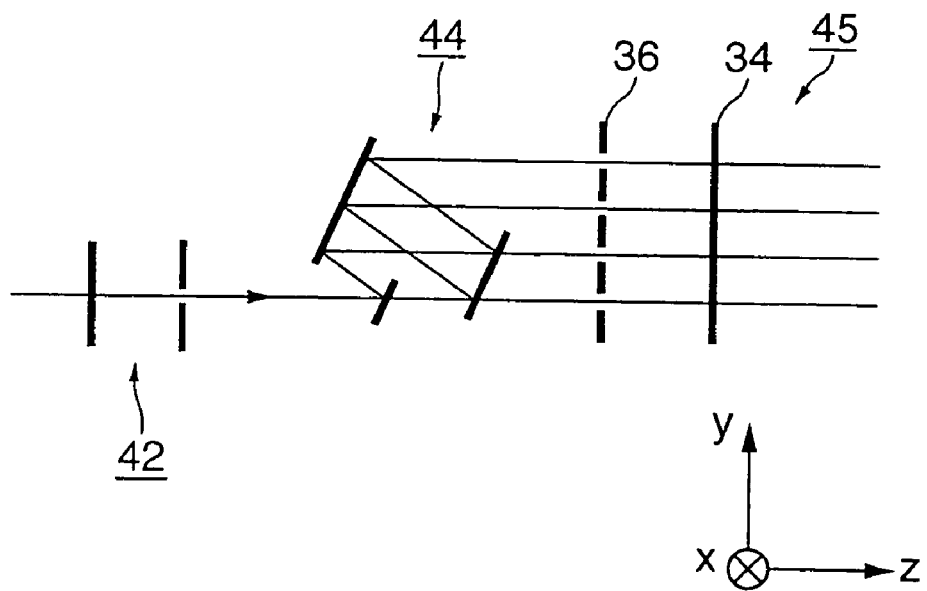
FIG. 9 is a schematic view showing a second splitting optical system of the laser annealing device shown in FIG. 7.

FIG. 8 shows the first horizontal laser beam splitting unit 41, first vertical laser beam splitting unit 43 and the light synthesis unit 45 from the X-direction in FIG. 7. FIG. 9 shows the second horizontal laser beam splitting unit 42, second vertical laser beam splitting unit 44 and the light synthesis unit 45 from the X-direction in FIG. 7. Referring to FIGS. 8 and 9, the first vertical laser beam splitting unit 43 and the second vertical laser beam splitting unit 44 use the same optical components, with the manner of arraying these optical components in the light splitting units also being the same. However, the first vertical laser beam splitting unit 43 and the second vertical laser beam splitting unit 44 are oriented in a position inverted by 180° about an axis parallel to the direction of the optical axis of the radiated laser light beam. That is, the first vertical laser beam splitting unit 43 and the second vertical laser beam splitting unit 44 are oriented in a position inverted by 180° relative to each other about the Z-axis in FIG. 3 as center.

The light synthesis unit 45 mixes the eight laser light beams, radiated from the first vertical laser beam splitting unit 43, and the eight laser light beams, radiated from the second vertical laser beam splitting unit 44, to radiate a matrix of a set of laser light beams composed of four columns of laser light beams along the X-direction or the horizontal direction and four columns of laser light beams along the Y-direction or along the vertical direction. The 16 laser light beams, radiated from the light synthesis unit 45, are all of the same light intensity. The structure of the light synthesis unit 45 is the same as that of the aforementioned light synthesis unit 21, on the proviso that, in the first embodiment, a column of laser light beam, arrayed along the X-direction, are synthesized, whereas, in the second embodiment, a matrix array of laser light beams are incident and hence the light separating surface needs to be large enough to be illuminated by eight laser light beams.

The light synthesis unit 45 includes a beam splitter 34 for reflecting and transmitting the incident laser light beam into two laser light beams. The light separating surface of the beam splitter 34 is perpendicular to the X-Z plane. The ratio of separation by transmission and reflection is designed to be 1:1.

The eight laser light beams, radiated by the first vertical laser beam splitting unit 43, are reflected by the mirror 35 and subsequently incident on the beam splitter 34 from its one surface, referred to below as a front surface. The eight laser beams, radiated from the second vertical laser beam splitting unit 44, are incident on the beam splitter 34 via its surface opposite to the surface on which the laser light from the first vertical laser beam splitting unit 43 was incident. This opposite surface is referred to below as a back surface.

The totality of 16 laser light beams, radiated from the first vertical laser beam splitting unit 43 and the second vertical laser beam splitting unit 44, is incident at a preset angle $\phi(0°<\phi<90°)$ to the light splitting surface of the beam splitter 34. It is noted that the sixteen laser light beams are incident so that the optical axes of the laser light beams radiated from the first vertical laser beam splitting unit 43 and those of the laser light beams radiated from the second vertical laser beam splitting unit 44 are not confounded with one another.

Moreover, the laser light beams, at positions (s, t), radiated from the first vertical laser beam splitting unit 43, and the laser light beams, at positions (s, t), radiated from the second vertical laser beam splitting unit 44, are incident on the same positions on the light separating surface of the beam splitter 34, even granting that the point where the laser light beams incident on the separating surface from the first vertical laser beam splitting unit is on the front surface of the light separating surface and the point where the laser light beams incident on the separating surface from the second vertical laser beam splitting unit is on the back surface thereof. Meanwhile, (s, t) indicate the locations of the laser light beams of the 2×4 matrix configuration and are of values such that s=1, 2 and t=1, 2, 3, 4. That is, the laser light beams on the same positions in the matrix are synthesized on the same axes.

The sixteen output laser light beams are incident on the lens array 46.

Figure 10:
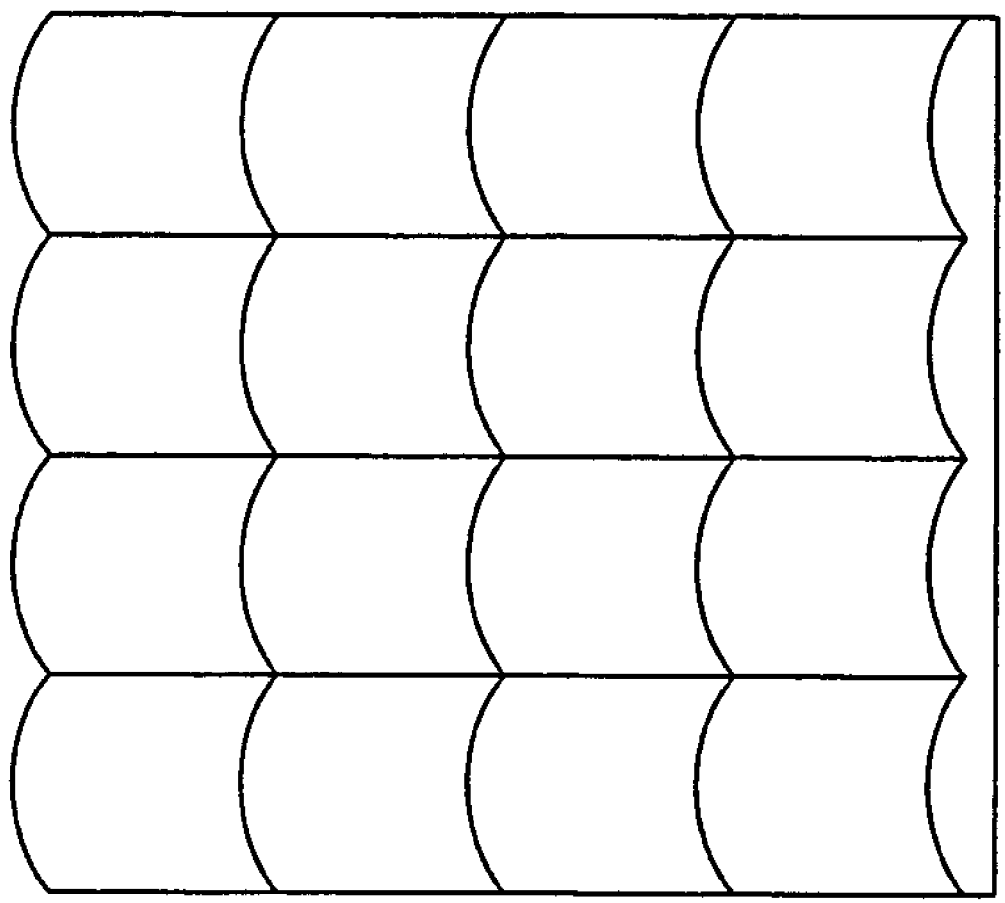
FIG. 10 is a perspective view showing an example of a lens array used in the laser annealing device according to the present invention.

The lens array 46 is made up of sixteen convex lenses, arranged in a matrix as shown in FIG. 10. The arraying interval of the convex lenses is the same as the interval of the output laser light beams, radiated from the light synthesis unit 45. The convex lenses are arranged on the optical axes of the respective output laser light beams. The output laser light beams from the lens array 46 are condensed and subsequently incident on the condenser lens 23.

The condenser lens 23 synthesizes the sixteen output laser light beams, condensed by the lens array 46, to illuminate the synthesized output laser light beams on a preset illumination area on the substrate 11.

In the above-described laser annealing device 40, according to the present invention, the laser light is split two-dimensionally. Even in such case, the first horizontal laser beam splitting unit 41 and the second horizontal laser beam splitting unit 42 use the same optical components, with the manner of arraying these optical components in the light splitting units also being the same. The first vertical laser beam splitting unit 43 and the second vertical laser beam splitting unit 44 also use the same optical components, with the manner of arraying these optical components in the light splitting units also being the same. The first horizontal laser beam splitting unit 41 and the second horizontal laser beam splitting unit 42 are arrayed rotated through 180° about the optical axis of the output laser light beam as center. The first vertical laser beam splitting unit 43 and the second vertical laser beam splitting unit 44 are also arrayed rotated through 180° about the optical axis of the output laser light beam as a center. Additionally, with the laser annealing device 40 of the present second embodiment, the laser light beams radiated from the first vertical laser beam splitting unit 43 are synthesized with the laser light beams radiated from the second vertical laser beam splitting unit 44 and which are of the same positions in the matrix array as those of the laser light beams from the first vertical laser beam splitting unit.

That is, with the laser annealing device 40 of the present invention, shown in FIG. 7, the laser light beams, separated by traversing the counterpart optical paths, are combined together.

That is, with the laser annealing device 40, according to the present invention, shown in FIG. 7, even if there is produced the difference in the proportions of separation by transmission and reflection by the beam splitters of the separating optical system, due to designing errors, such errors may be counterbalanced by synthesis of laser light beams.

The present invention is not limited to the above-described embodiments and, as may be apparent to those skilled in the art, various changes, substitutions or equivalents may be envisaged without departing from the scope of the invention as defined in the claims.

INDUSTRIAL APPLICABILITY

With the light illuminating device, according to the present invention, in which laser beams routed on counterpart optical paths may be synthesized with each other, the error components, produced on the splitting paths, may be counterbalanced to provide for an equal intensity of plural laser beams output from light synthesis means.

The invention claimed is:

1. A light illuminating apparatus comprising
   first radiating means of an optical structure having one or more light separating surface for transmitting and reflecting a light beam for splitting the light beam into a transmitted light beam and a reflected light beam, said first radiating means routing a sole light beam incident thereon through said one or more light separating surface to generate n light beams, where n is a natural number not less than two;
   second radiating means of the same optical structure as said first radiating means, said second radiating means routing a sole light beam incident thereon through said one or more light separating surface to generate n light beams; and
   light synthesizing means for synthesizing one light beam each of said n light beams radiated by said first radiating means so as to be incident on the light synthesizing means, and one light beam each of said n light beams radiated by said second radiating means so as to be incident on the light synthesizing means, to generate n light beams;
   said light synthesizing means synthesizing an m'th light beam, generated by said first radiating means, and an (n−m+1)st light beam, generated by said second radiating means, on one and the same axis, provided that the n light beams generated by said first radiating means and the n light beams generated by said second radiating means are ranked from a rank 1 to a rank n in the increasing order of optical path lengths of said n light beams resulting from transmission and reflection along passageways of generation of said light beams, m being an optional number from 1 to n.

2. The light illuminating apparatus according to claim 1 wherein said light synthesizing means includes a beam splitting surface for splitting an incident light beam into two light beams on reflection and transmission, the n light beams radiated by said first radiating means being incident on said beam splitting surface from one surface thereof, the n light beams radiated by said second radiating means being incident on said beam splitting surface from the other surface acting as a back surface thereof;
   a transmitted light beam of the m'th light beam of said first radiating means and a reflected light beam of the (n−m+1)st light beam of said second radiating means are synthesized on one and the same axis; and wherein
   a reflected light beam of the m'th light beam of said first radiating means and a transmitted light beam of the (n−m+1)st light beam of said second radiating means are synthesized on another one and the same axis.

3. The light illuminating apparatus according to claim 2 wherein said first radiating means radiates n light beams, arrayed parallel to one another on a plane perpendicular to said beam splitting surface, to said beam splitting surface; and wherein said second radiating means radiates to said beam splitting surface n light beams, arrayed parallel to one another on a surface, which is the same surface as that on which the n light beams radiated from said first radiating means are arrayed.

4. The light illuminating apparatus according to claim 3 wherein a distance tk between the light separating surface of the first beam splitter and the light separating surface of the (k+1)st beam splitter is set so as to be not less than $(2^{(j-1)}-1) \times L/(2\cos\theta)$, where $\theta$ is the angle of incidence of a laser light beam incident on each beam splitter, L is the coherence length of the light beams radiated from said light source and n is the refractive index of a medium between the light separating surfaces; and wherein the distance between the light separating surface of the first beam splitter and the light reflecting surface of the reflective mirror is set so as to be not less than $L/(2n\cos\theta)$, where $\theta$ is the angle of incidence of a laser light beam incident on each beam splitter, L is the coherence length of the light beams radiated from said laser light source and n is the refractive index of a medium between the light separating surface of the first beam splitter and the light reflecting surface of said reflective mirror.

5. The light illuminating apparatus according to claim 4 wherein the light splitting optical system of the first radiating means and the light splitting optical system of the second radiating means are arrayed inverted relative to each other with respect to the arraying direction of n light beams radiated from said first and second radiating means.

6. The light illuminating apparatus according to claim 4 wherein the reflected light beam and the transmitted light beam, separated by said light separating surface of said beam splitter, has a light intensity ratio of 1:1.

7. The light illuminating apparatus according to claim 1 wherein a light splitting optical system, included in each of said first and second radiating means, includes first to j'th j beam splitters, each including a light separating surface for separating an incident light beam into a transmitted light beam and a reflected light beam, by transmission and reflection, and for radiating the reflected light beam along a surface perpendicular to a beam splitting surface of said light synthesizing means, said light separating surfaces being arrayed parallel to one another, j being such that $n=2^j$ and being a natural number equal to or larger than 1; and a reflecting mirror having a light reflecting surface for reflecting an incident light beam, said light reflecting surface being parallel to said light separating surface of each beam splitter, said reflecting mirror being arranged at such a position where the reflected laser beams from the totality of the beam splitters fall on said light reflecting surface; wherein a sole light beam is incident in the first beam splitter, said first beam splitter radiating a sole transmitted light beam and a sole reflected light beam;

$2^{(k-1)}$ light beams, transmitted through the k'th beam splitter, are incident on the (k+1)st beam splitter, $2^{(k-1)}$ light beams, reflected by the k'th beam splitter, are incident after reflection by said reflective mirror on said (k+1)st beam splitter, said (k+1)st beam splitter radiating $2^k$ transmitted light beams and $2^k$ reflected light beams, k being an integer not less than 1 and not larger than (j−1);

the j'th beam splitter radiating $2^{(j-1)}$ transmitted light beams to outside and radiating $2^{(j-1)}$ reflected light beams to said reflective mirror;

said reflecting mirror reflecting the $2^{(j-1)}$ reflected light beams of the j'th beam splitter to radiate the resulting laser beams to outside; and wherein the distance between the light separating surface of said k'th beam splitter and the light separating surface of said (k+1)st beam splitter and the distance between the light separating surfaces of the beam splitters and the light reflecting surface of said reflective mirror are adjusted so that the difference of the optical path lengths of the optical paths of the light beam radiated from the light source will be larger than the coherence length.

* * * * *

UNITED STATES PATENT AND TRADEMARK OFFICE
CERTIFICATE OF CORRECTION

PATENT NO. : 7,154,673 B2  Page 1 of 1
APPLICATION NO. : 10/533946
DATED : December 26, 2006
INVENTOR(S) : Koichi Tsukihara et al.

It is certified that error appears in the above-identified patent and that said Letters Patent is hereby corrected as shown below:

Title Page:
Item (54) should be read as follows:
-- LIGHT ILLUMINATING APPARATUS--.

Signed and Sealed this

Fifth Day of June, 2007

JON W. DUDAS
*Director of the United States Patent and Trademark Office*